United States Patent [19]

Ishikawa

[11] Patent Number: 4,654,607
[45] Date of Patent: Mar. 31, 1987

[54] MODULATION CONTROL CIRCUIT FOR AN AMPLITUDE MODULATOR

[75] Inventor: Nobuyuki Ishikawa, Kanagawa, Japan

[73] Assignee: Sony Corporation, Tokyo, Japan

[21] Appl. No.: 824,210

[22] Filed: Jan. 30, 1986

[30] Foreign Application Priority Data

Jan. 31, 1985 [JP] Japan .................. 60-017131

[51] Int. Cl.$^4$ .................................. H03C 1/42
[52] U.S. Cl. ..................... 332/31 T; 332/38; 332/40; 332/41; 332/48; 358/23; 360/29; 455/108
[58] Field of Search ............. 332/31 T, 38, 40, 41, 332/48; 455/108; 358/23; 360/29

[56] References Cited

U.S. PATENT DOCUMENTS 4,338,580  7/1982  Gay ..................... 332/31 T
4,547,752 10/1985  Shinbara ............... 332/31 T

FOREIGN PATENT DOCUMENTS 56-25809   3/1981  Japan .................. 332/31 T
56-149803 11/1981  Japan .................. 332/31 T Primary Examiner—Siegfried H. Grimm

[57] ABSTRACT

An amplitude modulator having first and second differential amplifiers which are commonly supplied with an amplitude modulated carrier signal and a third differential amplifier which is connected to the emitter current path of the first differential amplifier, wherein the third differential amplifier is supplied with a video signal for modulation through a limiter and a current value of a current source connected to the third differential amplifier is adjusted to thereby adjust a modulation degree of an amplitude modulated video signal derived from the first and second differential amplifiers so that a white level of an input video signal can be positively prevented from being deteriorated.

7 Claims, 5 Drawing Figures

MODULATION CONTROL CIRCUIT FOR AN AMPLITUDE MODULATOR

BACKGROUND OF THE INVENTION

1. Field of the Invention

This invention relates generally to an amplitude modulator and, more particularly, is directed to an amplitude modulator which can finely adjust an amplitude modulation degree.

2. Description of the Prior Art

An RF (radio frequency) converter for frequency-converting an input video signal into a television signal for a vacant channel is generally constructed as shown in FIG. 1.

In FIG. 1, reference letter $e_V$ designates an input video signal and a reference letter $e_A$ designates an input audio signal. The input video signal $e_V$ is supplied through an over-modulation preventing limiter 2 to an amplitude (AM) modulator 10 as a video signal $e_V'$ in which an AM carrier signal fc (video carrier frequency of a vacant channel) is amplitude-modulated by this input video signal $e_V'$ and then an output signal, which is frequency-converted to a television signal of the vacant channel, is developed at an output terminal 10A.

By the way, when it is required for the RF converter thus constructed to finely adjust the amplitude modulation degree of the output signal, in the prior art, it is general that the amplitude modulation degree is adjusted finely by adjusting the amplitude of the input video signal $e_V$. However, when the amplitude modulation degree is adjusted by adjusting the amplitude of the input video signal $e_V$, there occur the following problems.

Although it is desirable that a difference between a modulation degree at a normal state and a maximum modulation degree determined by the limiter level of the limiter 2 is always constant, if the amplitude of the input video signal $e_V$ is varied, the difference between the modulation degree at the normal state and the maximum modulation degree is also varied. For example, if the amplitude of the input video signal $e_V$ is increased so as to increase the modulation degree at the normal state, the difference between the modulation degree at the normal state and the maximum modulation degree is reduced so that in such case, troubles, such as the deterioration of a white level of the video signal and the like will easily occur.

OBJECTS AND SUMMARY OF THE INVENTION

Accordingly, it is an object of the present invention to provide an improved amplitude (AM) modulator which is free from the defects encountered in the prior art.

Another object of the present invention is to provide an improved AM modulator in which the modulation degree can be adjusted without the deterioration of a white level of a video signal.

A further object of the present invention is to provide an improved AM modulator in which the leakage of the base-band signal is minimized.

A still further object of the present invention is to provide an improved AM modulator in which the secondary spurious component in the modulated output signal can be suppressed.

According to one aspect of the present invention, there is provided an amplitude modulator which comprises first and second differential amplifiers commonly supplied with an amplitude-modulated carrier signal and a third differential amplifier connected to an emitter current path of the first differential amplifier, wherein the third differential amplifier is supplied with a video signal for the modulation through a limiter and a current value of a current source connected to the third differential amplifier is adjusted to thereby adjust a modulation degree of an amplitude modulated video signal derived from the first and second differential amplifiers so that a white level of a video signal can be positively prevented from being deteriorated.

These and other objects, features and advantages of the present invention will become apparent from the following detailed description of the preferred embodiment taken in conjuction with the accompanying drawings, throughout which like reference numerals designate like elements and parts.

DESCRIPTION OF THE PREFERRED EMBODIMENTS

Now, an embodiment of an amplitude (AM) modulator according to the present invention will hereinafter be described in detail with reference to FIG. 2 and the following material.

Figure 1:
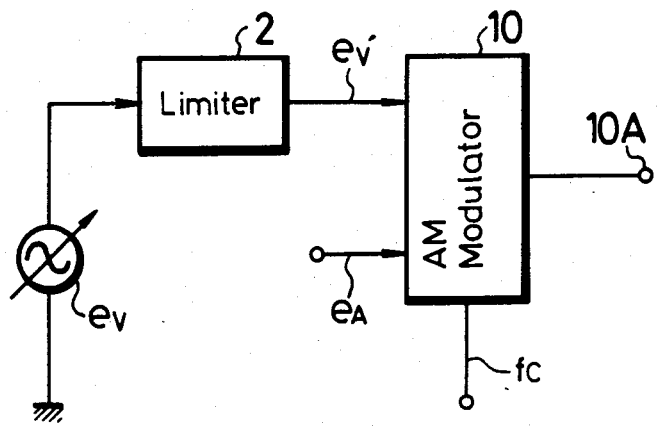
FIG. 1 is a block diagram showing one example of a prior art RF converter.
Figure 2:
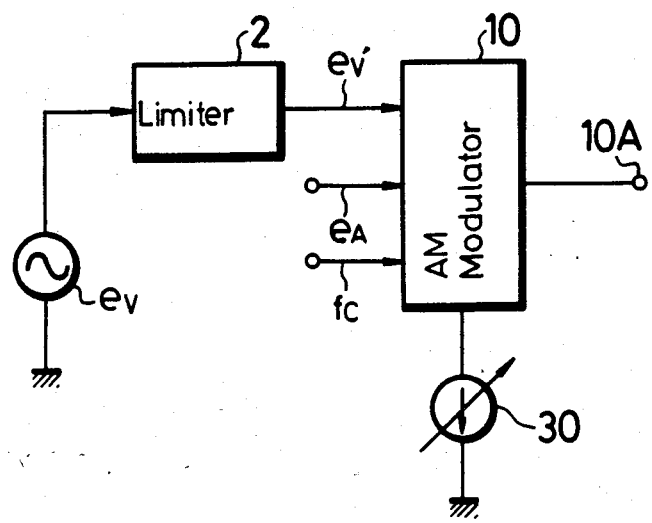
FIG. 2 is a block diagram showing a fundamental construction of an RF converter to which the present invention is applied.

In this invention, a modulation degree m is finely adjusted by a variable current source 30 provided in an AM modulator 10 as shown in FIG. 2 which is a block diagram showing one example of an RF converter to which the present invention is applied. In FIG. 2, like parts corresponding to those of FIG. 1 are marked with the same references and will not be described.

Figure 3:
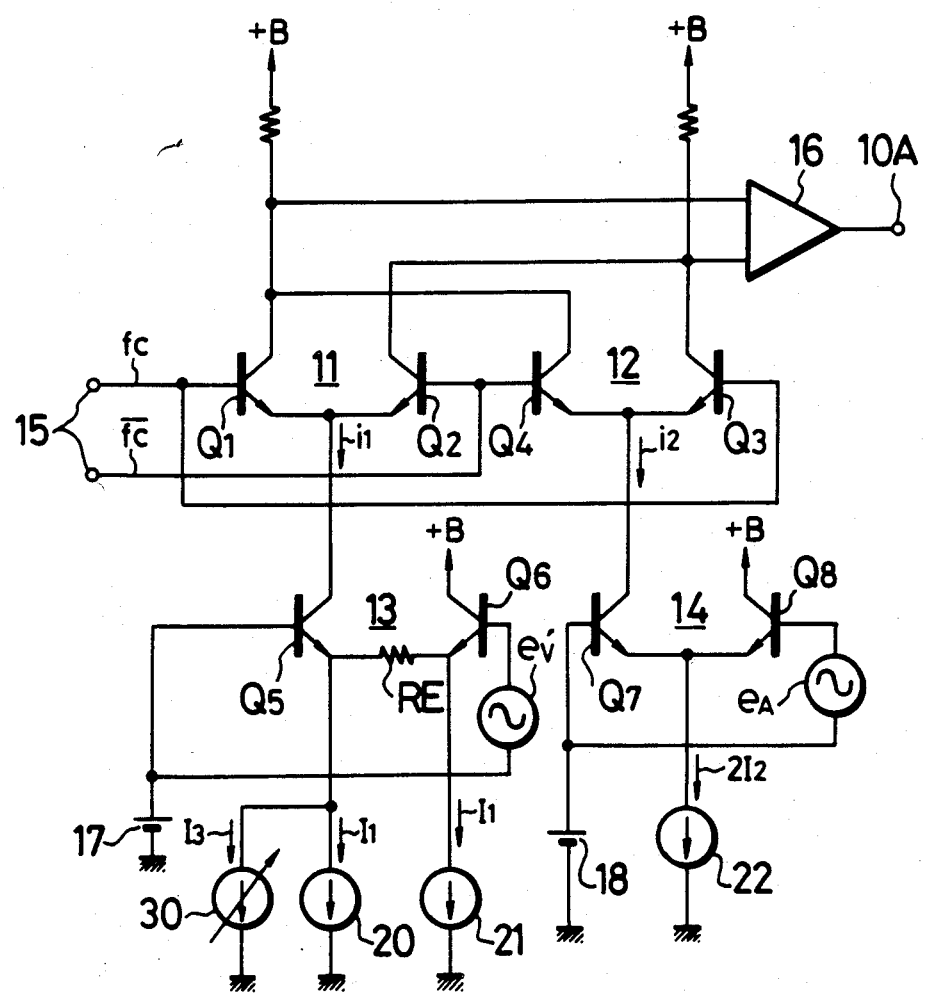
FIG. 3 is a connection diagram shown an embodiment of an AM modulator according to the present invention.

FIG. 3 is a connection diagram which illustrates an example of the AM modulator 10 according to the present invention. This AM modulator 10 includes first and second differential amplifiers 11 and 12 to which an AM carrier fc is commonly supplied from terminals 15. The first differential amplifier 11 is formed of transistors Q1 and Q2, while the second differential amplifier 12 is formed of transistors Q3 and Q4. Collectors of transistors Q1, Q4 and collectors of transistors Q2, Q3 are respectively connected together and the outputs therefrom are both supplied to a differential amplifier 16. Emitters of the transistors Q1, Q2 and emitters of the transistors Q3, Q4 are respectively connected together.

To the common emitter current path of the first differential amplifier 11, there is connected in series one transistor Q5 which forms a third differential amplifier 13 with transistor Q6. A collector of the other transistor Q6 of the third differential amplifier 13 is connected to a voltage source +B. Between the bases of these transistors Q5 and Q6, there is applied an input video signal $e_V'$ which is derived through the limiter 2 (FIG. 2).

Reference numeral 17 designates a bias DC voltage source.

The emitters of the transistors Q5 and Q6 are coupled together through a resistor RE and constant current sources 20 and 21 are connected between the emitters of the transistors Q5 and Q6 and ground, respectively. A variable current source 30 is connected in parallel to one constant current source 20. While in this embodiment the resistor RE is connected between the emitters of the transistors Q5 and Q6 and the constant current sources 20 and 21 are respectively connected between the emitters thereof and ground, a version of a circuit arrangement is possible in which a resistor is connected between the emitters of the transistors Q5 and Q6 and a constant current source is connected between an intermediate point of the resistor and ground. Further, when the amplitude of a video signal is small, a version of a circuit arrangement is also possible in which the emitters of the transistors Q5 and Q6 are directly coupled to each other and a constant current source is connected between the connection point of the emitters and ground. At any rate, it is sufficient that over a range in which the amplitude of the video signal is varied, the transistors Q5 and Q6 are operated in a linear region.

To the common emitter current path of the second differential amplifier 12, there is connected in series one transistor Q7 which forms a fourth differential amplifier 14 with transistor Q8. A collector of the other transistor Q8 of the fourth differential amplifier 14 is connected to a voltage source +B. Between the bases of these transistors Q7 and Q8, there is applied a frequency-modulated input audio signal $e_A$.

Reference numeral 18 designates a bias DC power source and reference letter 22 designates a constant current source which is connected between the connection point of the emitters of the transistors Q7, Q8 and ground. If the input audio signal $e_A$ is not considered, the fourth differential amplifier 14 becomes unnecessary and the collector of the transistor Q6 is connected to the common emitter current path of the second differential amplifier 12.

In the AM modulator 10 formed as above, let it be assumed that currents flowing through the common emitters of the first and second differential amplifiers 11 and 12 be $i_1$ and $i_2$; current values of the current sources 20 and 21 be $I_1$ and those of the current sources 22 and 30 be $I_2$ and $I_3$; and a case where the current value $I_3$ is zero will be considered.

Then, an RF output $i$ developed at the output terminal 10A is given as by the following Eq. (1)

$$i = i_2 - i_1 \quad (1)$$

If a p—p value of the input video signal $e_V$ is calculated as 0.5 V p—p = ±0.25 V, the maximum and minimum values of the current $i_1$ are given by the following Eqs. (2) and (3)

$$i_{1max} = I_1 + \frac{0.25}{RE} \quad (2)$$

$$i_{1min} = I_2 - \frac{0.25}{RE} \quad (3)$$

If the amplitude of the AM carrier fc is taken as $I_0$, the modulation degree $\overline{m}$ is expressed by the following Eq. (4), $$m = \frac{I_{0max} - I_{0min}}{I_{0max}} \quad (4)$$

and also the following Eqs. (5) and (6) are established $$I_{0max} = i_2 - i_{1min} \quad (5)$$

$$I_{0min} = i_2 - i_{1max} \quad (6)$$

Thus, the following Eq. (7) can be obtained $$m = \frac{\left\{i_2 - \left(I_1 - \frac{0.25}{RE}\right)\right\} - \left\{i_2 - \left(I_1 + \frac{0.25}{RE}\right)\right\}}{i_2 - \left(I_1 - \frac{0.25}{RE}\right)} \quad (7)$$

$$= \frac{\frac{0.5}{RE}}{i_2 + \frac{0.25}{RE} - I_1}$$

Since the above mentioned Eq. (7) is established even when the variable current source 30 is connected as shown in FIG. 3, $I_1$ can be substituted with $I_1 + I_3$, and Eq. (7) rewritten as the following Eq. (8)

$$m = \frac{\frac{0.5}{RE}}{i_2 + \frac{0.25}{RE} - (I_1 + I_3)} \quad (8)$$

Accordingly, the modulation degree m is varied by varying the current $I_3$. For instance, when $i_2 = I_2$, RE = 3.5Ωk, $I_2 = 307$ μA and $I_1 = 200$ μA, if $I_3$ is varied within a range of ±10 μA, the modulation degree m is given by the following Eq. (9)

$$\left.\begin{array}{l}\text{When } I_3 = 0, m_0 = 0.80 \\ \text{When } I_3 = 10 \text{ μA}, m_+ = 0.848 \\ \text{When } I_3 = -10 \text{ μA}, m_- = 0.758\end{array}\right\} \quad (9)$$

As described above, when the normal modulation degree $m_0$ is 80%, the modulation degree m can be finely adjusted to be 84.8% or 75.8% by finely adjusting $I_3 = \pm 10$ μA.

Further, when the output of the AM modulator is obtained through the differential amplifier 16, there can be achieved effects which will be described below. In the first place, a secondary spurious component contained in the RF output can be suppressed; secondly, the leakage of the base-band component can be minimized so that a band pass filter connected to the outside can be arranged to have a low Q and the circuit can be simplified in construction; and thirdly, a differential phase (DP) can be suppressed sufficiently so that an RF-converted output having a satisfactory quality can be obtained.

Figure 4:
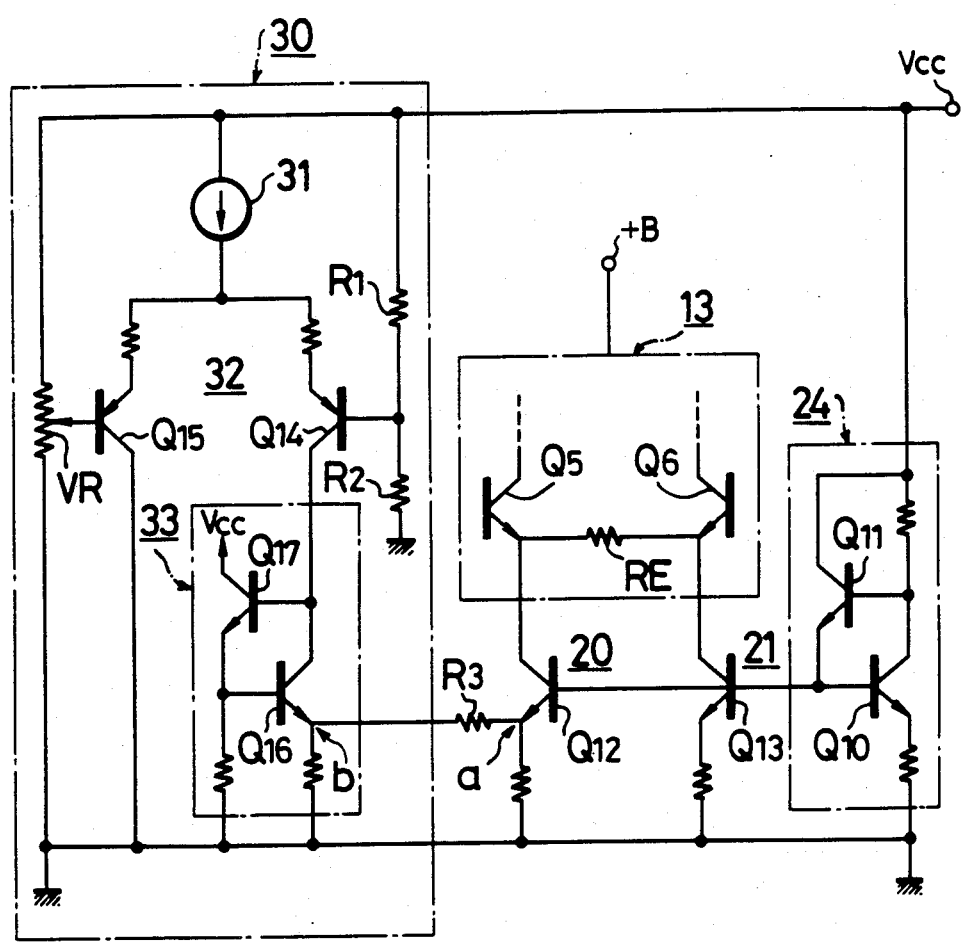
FIGS. 4 and 5 are respectively connection diagrams each showing an example of a variable current source used in the present invention.

FIG. 4 schematically illustrates practical examples of the current sources 20, 21 and the variable current source 30 shown in FIG. 3.

Referring to FIG. 4, a bias circuit 24 formed of transistors Q10 and Q11 and a transistor Q12 connected between the emitter of the transistor Q5 and the ground constitute the constant current source 20 of a currenr mirror construction. Whereas, the bias circuit 24 and a transistor Q13 connected between the emitter of the transistor Q6 and the ground constitute the other constant current source 21 of a current mirror circuit construction.

The variable current source 30 includes a current source 31 and a differential amplifier 32, in which a base of one transistor Q14, which forms the differential amplifier 32, is supplied with a predetermined reference voltage by a pair of resistors $R_1$ and $R_2$, while a modulation degree control voltage determined by a potentiometer VR is supplied to a base of the other transistor Q15 of the differential amplifier 32. Then, between the collector of the transistor Q14 and ground, there is connected a bias circuit 33 formed of transistors Q16 and Q17 and which has the same construction as that of the bias circuit 24, in which the emitter of the transistor Q16 is connected through a resistor $R_3$ to the emitter of the transistor Q12.

With the circuit arrangement thus constructed, when the potentiometer VR is, for example, adjusted so as to increase the base potential of the transistor Q15, the collector current of the transistor Q14 is increased and a potential at a point b or the emitter of the transistor Q16 is increased so that current flows through the resistor $R_3$ into a point a or the emitter of the transistor Q12. Since the potential at the point a is maintained so as to be a constant value by the bias circuit 24 of the current mirror construction, the collector current of the transistor Q12 decreases a certain amount. This becomes the same as in the case where the current value $I_3$ is adjusted to be a negative value as shown in FIG. 3.

On the contrary, when the potentiometer VR is adjusted to thereby lower the base potential of the transistor Q15, the collector current of the transistor Q14 is decreased and a current flows through the resistor $R_3$ into the side of point b so that the collector current of the transistor Q12 is increased. Accordingly, this becomes equivalent to the case in which the current value $I_3$ is adjusted to be a positive value. Therefore, the modulation degree m can be varied by adjusting the potentiometer VR.

Even if the base potential of the transistor Q12 fluctuates with changes in temperature, since the bias circuit 33 of the current mirror construction is provided, it is possible to cancel fluctuations of the base potential of the transistor Q12. For example, when the base potential of the transistor Q12 is increased by the fluctuation of the temperature, the collector current thereof is increased. However, the base potential of the transistor Q16 is increased, too and hence the potential at the point b is also increased and current flows through the resistor $R_3$ into the point a so that the increase of the collector current of the transistor Q12 is suppressed, thus preventing the current of the transistor Q12 from fluctuating as the temperature fluctuates.

Figure 5:
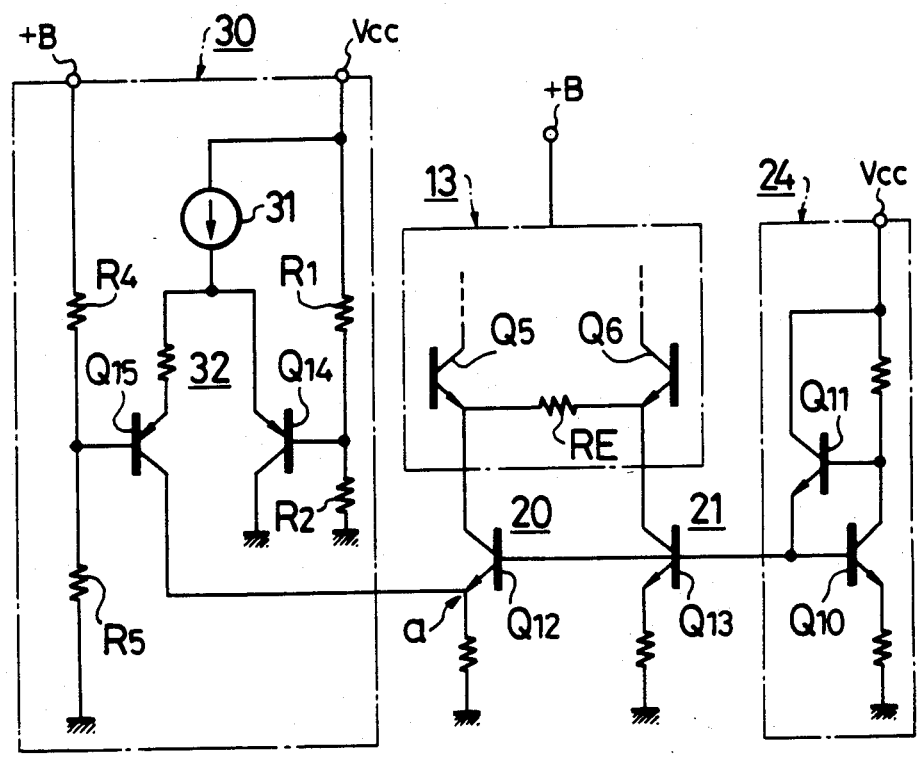

While in the example of FIG. 4 the modulation degree m can be varied by changing the voltage applied to the transistor Q15 by the potentiometer VR, it is also possible to control the modulation degree m by utilizing a voltage which is varied as the power source voltage itself is varied. In this case, if the circuit is constructed as shown in FIG. 5, it is possible to suppress fluctuations of the modulation degree m which fluctuate with the fluctuations of the power source voltage. In FIG. 5, like parts corresponding to those of FIG. 4 are marked with the same references and will not be described.

Referring to FIG. 5, the reference voltage to be supplied to the base of one transistor Q14 which forms the differential amplifier 32 is formed by utilizing a power source voltage Vcc that is regulated in voltage. Accordingly, a pair of resistors $R_1$ and $R_2$ are connected between this power source voltage Vcc and ground and the connection point between the resistors $R_1$ and $R_2$ is connected to the base of the transistor Q14. On the other hand, the base of the other transistor Q15 is supplied with a predetermined voltage from a voltage source +B to which another load is connected. To this end, a pair of resistors $R_4$ and $R_5$ are connected between the voltage source +B and ground and a divided voltage obtained at the connection point between the resistors $R_4$ and $R_5$ is supplied to the base of the transistor Q15 and the collector current of the transistor Q15 is supplied to the point a.

With this circuit arrangement, if the power source voltage +B is fluctuated, the collector current of the transistor Q15 is also varied so that the collector current of the transistor Q12 is varied to thereby vary the modulation degree m.

It is a recent trend that an integrated circuit (IC) is capable of operating at a low power source voltage and by way of example, about 5 V is generally used as the power source voltage thereof. As will be clear from the circuit arrangement of the AM modulator shown in FIG. 3, it includes cascade connections of three stages between the power sources so that the highest voltage must be used as the power voltage of the AM modulator. For this reason, it is normal that the power source voltage +B, which is not stabilized, is used. Due to fluctuations of this unstabilized voltage, the collector-emitter voltage of each transistor is varied to thereby move the operation point so that the modulation degree may be varied. For example, when the power source voltage +B becomes higher than the normal voltage, the modulation degree may be lowered. However, according to the circuit arrangement shown in FIG. 5, it is possible to cancel out the fluctuations of the modulation degree m due to fluctuations of the power source voltage. Specifically, when the modulation degree is normal, the base potentials of the transistors Q14 and Q15 are determined to be equal to each other. If under this stage the load connected to the power source voltage +B is varied and hence the power source voltage +B is fluctuated, for example, increased, the collector current of the transistor Q15 is decreased by the amount corresponding to the difference between the base potentials of the transistor Q15 and the transistor Q14, whereby the collector current of the transistor Q12 is increased by the corresponding amount. As a result, as will be clear from the above description, in this case, the modulation degree m is increased.

Accordingly, the decrease of the modulation degree m due to the increase of the power source voltage can be suppressed and hence the modulation degree m can always be made constant.

According to the present invention as set forth above, since the modulation degree m can be finely adjusted by controlling the variable current source 30 provided in the AM modulator 10, it is possible to easily obtain a modulation degree that the user desires to have. In this case, the relation between the maximum modulation degree determined by the limiter level of the limiter 2 and the modulation degree at the normal state of the input video signal $e_V$ becomes always constant. As a result, it is possible to avoid the deterioration of the white level of the video signal, etc. caused by adjusting the amplitude of the input video signal $e_V$.

Accordingly, this invention is very suitable for the AM modulator used as the above mentioned RF converter.

The above description is given on the preferred embodiments of the invention but it will be apparent that many modifications and variations could be effected by one skilled in the art without departing from the spirit or scope of the novel concepts of the invention so that the scope of the invention should be determined by the appended claimes only.

I claim as my invention:

1. An amplitude modulator for modulating a carrier signal by a video signal comprising:
   (A) a first differential amplifier having first and second transistors, emitters of said first and second transistors being connected together, said carrier signal being supplied between bases of said first and second transistors;
   (B) a second differential amplifier having third and fourth transistors, emitters of said third and fourth transistors being connected together, said carrier signal being supplied between bases of said third and fourth transistors, a collector of said third transistor being connected to the collector of said second transistor to form a first output terminal, and a collector of said fourth transistor being connected to the collector of said first transistor to form a second output terminal;
   (C) a third differential amplifier having fifth and sixth transistors, said video signal being supplied between bases of said fifth and sixth transistors, said fifth and sixth transistors operating in a linear region for the supplied video signal, the output current of said third differential amplifier controlling at least one of the emitter currents of said first and second differential amplifiers;
   (D) a current source connected to the emitters of said fifth and sixth transistors;
   (E) means for controlling the current of said current source, whereby the modulation degree of said amplitude modulator is controlled; and
   (F) a fourth differential amplifier having seventh and eighth transistors, an audio signal being supplied between bases of said seventh and eighth transistors, one of the collectors of said seventh and eighth transistors being connected to the common emitter point of said third and fourth transistors, and one of the collectors of said fifth and sixth transistors being connected to the common emitter point of said first and second transistors.

2. An amplitude modulator according to claim 1, wherein said current source includes a bias circuit and a series circuit of a current source transistor and a resistor, an output bias voltage of said bias circuit being supplied to a base of said current source transistor.

3. An amplitude modulator according to claim 2, wherein said controlling means includes a variable voltage source, and a resistor connected between said variable voltage source and a connection point of said current source transistor and the resistor.

4. An amplitude modulator according to claim 3, wherein said variable voltage source includes a control differential amplifier having two input terminals supplied with a reference voltage and a control voltage respectively and at least one output controlling the voltage of said variable voltage source.

5. An amplitude modulator according to claim 2, wherein said control means includes a voltage detector for detecting the fluctuation of a power supply voltage of said amplitude modulator, and the current flowing through said current source transistor being controlled by the output of said voltage detector.

6. An amplitude modulator according to claim 5, wherein said voltage detector includes a detecting differential amplifier having two input terminals supplied with a reference voltage and a voltage relating to said power supply voltage respectively and an output connected to a connection point of said current source transistor and the resistor.

7. An amplitude modulator according to claim 1, further comprising an output differential amplifier having two inputs connected to said first and second output terminals.

* * * * *